(12) United States Patent
Roohparvar

(10) Patent No.: US 7,408,805 B2
(45) Date of Patent: Aug. 5, 2008

(54) REDUCING DELAYS IN WORD LINE SELECTION

(75) Inventor: Frankie F. Roohparvar, Monte Sereno, CA (US)

(73) Assignee: Micron Technology, Inc., Boise, ID (US)

( * ) Notice: Subject to any disclaimer, the term of this patent is extended or adjusted under 35 U.S.C. 154(b) by 275 days.

(21) Appl. No.: 11/323,451

(22) Filed: Dec. 30, 2005

(65) Prior Publication Data

US 2006/0108632 A1    May 25, 2006

Related U.S. Application Data

(62) Division of application No. 10/909,716, filed on Aug. 2, 2004, now Pat. No. 7,193,266.

(51) Int. Cl.
G11C 11/34 (2006.01)
G11C 16/04 (2006.01)
G11C 16/06 (2006.01)

(52) U.S. Cl. .............................. 365/185.17; 365/185.05
(58) Field of Classification Search ................. 257/316, 257/390, E29.129, E29.3; 365/185.05, 185.17
See application file for complete search history.

(56) References Cited

U.S. PATENT DOCUMENTS

| 5,717,645 A | 2/1998 | Kengeri |
| 5,933,387 A | 8/1999 | Worley |
| 6,240,046 B1 | 5/2001 | Proebsting |
| 6,760,267 B2 | 7/2004 | Chevallier |
| 2005/0202622 A1* | 9/2005 | Violette et al. .............. 438/201 |

* cited by examiner

*Primary Examiner*—Ngan Ngo
(74) *Attorney, Agent, or Firm*—Leffert Jay & Polglaze, P.A.

(57) ABSTRACT

Delays in selecting word lines of a NAND memory device are reduced by respectively connecting conductive straps to word lines of a subset of the word lines of the memory device.

18 Claims, 6 Drawing Sheets

REDUCING DELAYS IN WORD LINE SELECTION

CROSS-REFERENCE TO RELATED APPLICATION

This is a divisional application of application Ser. No. 10/909,716, titled "STRAPPING WORD LINES OF NAND MEMORY DEVICES," filed Aug. 2, 2004 (pending) now U.S. Pat. No. 7,193,266, which application is assigned to the assignee of the present invention and the entire contents of which are incorporated herein by reference.

TECHNICAL FIELD OF THE INVENTION

The present invention relates generally to memory devices and in particular the present invention relates to reducing delays in word line selection.

BACKGROUND OF THE INVENTION

Memory devices are typically provided as internal storage areas in computers. The term memory identifies data storage that comes in the form of integrated circuit chips. In general, memory devices contain an array of memory cells for storing data, and row and column decoder circuits coupled to the array of memory cells for accessing the array of memory cells in response to an external address.

One type of memory is a non-volatile memory known as flash memory. A flash memory is a type of EEPROM (electrically-erasable programmable read-only memory) that can be erased and reprogrammed in blocks. Many modern personal computers (PCs) have their BIOS stored on a flash memory chip so that it can easily be updated if necessary. Such a BIOS is sometimes called a flash BIOS. Flash memory is also popular in wireless electronic devices because it enables the manufacturer to support new communication protocols as they become standardized and to provide the ability to remotely upgrade the device for enhanced features.

A typical flash memory comprises a memory array that includes a large number of memory cells arranged in row and column fashion. Each of the memory cells includes a floating-gate field-effect transistor capable of holding a charge. The cells are usually grouped into blocks. Each of the cells within a block can be electrically programmed on an individual basis by charging the floating gate. The charge can be removed from the floating gate by a block erase operation. The data in a cell is determined by the presence or absence of the charge on the floating gate.

A NAND flash memory device is a common type of flash memory device, so called for the logical form in which the basic memory cell configuration is arranged. Typically, the array of memory cells for NAND flash memory devices is arranged such that the control gate of each memory cell of a row of the array is connected to a word line. Columns of the array include strings (often termed NAND strings) of memory cells connected together in series, source to drain, between a pair of select lines, a source select line and a drain select line. The source select line includes a source select gate at each intersection between a NAND string and the source select line, and the drain select line includes a drain select gate at each intersection between a NAND string and the drain select line. The select gates are typically field-effect transistors. Each source select gate is connected to a source line, while each drain select gate is connected to a column bit line.

The memory array is accessed by a row decoder activating a row of memory cells by selecting the word line connected to a control gate of a memory cell. In addition, the word lines connected to the control gates of unselected memory cells of each string are driven to operate the unselected memory cells of each string as pass transistors, so that they pass current in a manner that is unrestricted by their stored data values. Current then flows from the source line to the column bit line through each NAND string via the corresponding select gates, restricted only by the selected memory cells of each string. This places the current-encoded data values of the row of selected memory cells on the column bit lines.

There is usually a delay in the selection of the word lines. One reason for this delay is that the word lines can have a relatively large resistance; because as memory devices become denser, the cross-sectional area of the word lines becomes smaller and the word lines typically extend to more memory cells. While the use of higher conductivity materials would help alleviate the resistance issues, such materials, e.g., metals, can present issues of their own. For example, the word lines are often too close together to form them from metal because existing fabrication methods may result in metal-to-metal shorts between successive word lines.

For the reasons stated above, and for other reasons stated below which will become apparent to those skilled in the art upon reading and understanding the present specification, there is a need in the art for reducing word-line resistance in NAND memory devices.

SUMMARY

The above-mentioned problems with word-line resistance and other problems are addressed by the present invention and will be understood by reading and studying the following specification.

For one embodiment, the invention provides a method of reducing delays in selecting word lines of a NAND memory device, including respectively connecting conductive straps to word lines of a subset of the word lines of the memory device.

Further embodiments of the invention include methods of varying scope.

DETAILED DESCRIPTION

Figure 1:
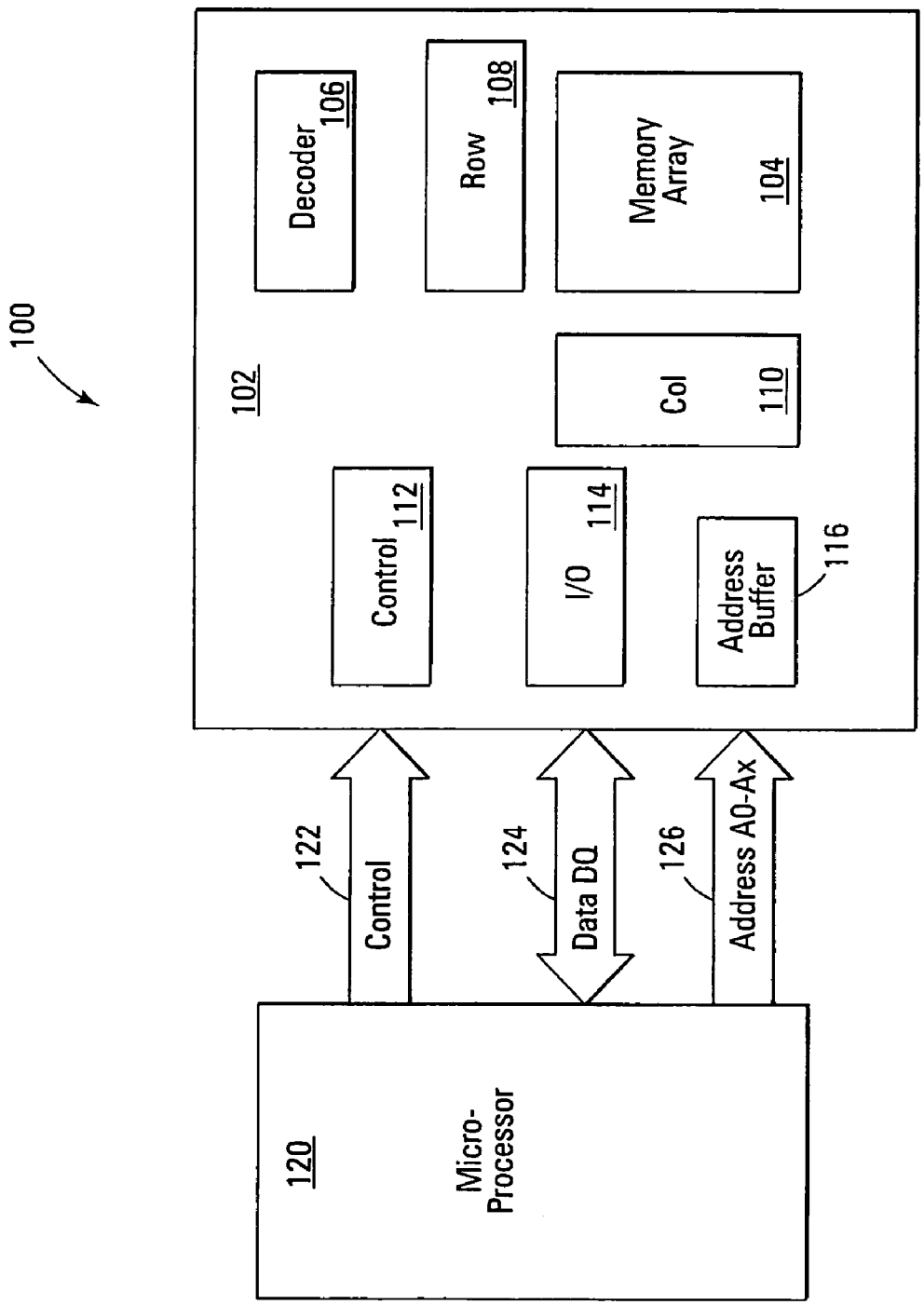
FIG. 1 is a simplified block diagram of a memory system, according to an embodiment of the invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The term wafer or substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The following detailed description is, therefore, not to be taken in a limiting sense, and the scope of the present invention is defined only by the appended claims and equivalents thereof.

FIG. 1 is a simplified block diagram of a memory system 100, according to an embodiment of the invention. Memory system 100 includes an integrated circuit NAND flash memory device 102 that includes an array of flash memory cells 104, an address decoder 106, row access circuitry 108, column access circuitry 110, control circuitry 112, Input/Output (I/O) circuitry 114, and an address buffer 116. Memory system 100 includes an external microprocessor 120, or memory controller, electrically connected to memory device 102 for memory accessing as part of an electronic system. The memory device 102 receives control signals from the processor 120 over a control link 122. The memory cells are used to store data that are accessed via a data (DQ) link 124. Address signals are received via an address link 126 that are decoded at address decoder 106 to access the memory array 104. Address buffer circuit 116 latches the address signals. The memory cells are accessed in response to the control signals and the address signals. It will be appreciated by those skilled in the art that additional circuitry and control signals can be provided, and that the memory device of FIG. 1 has been simplified to help focus on the invention.

Figure 2:
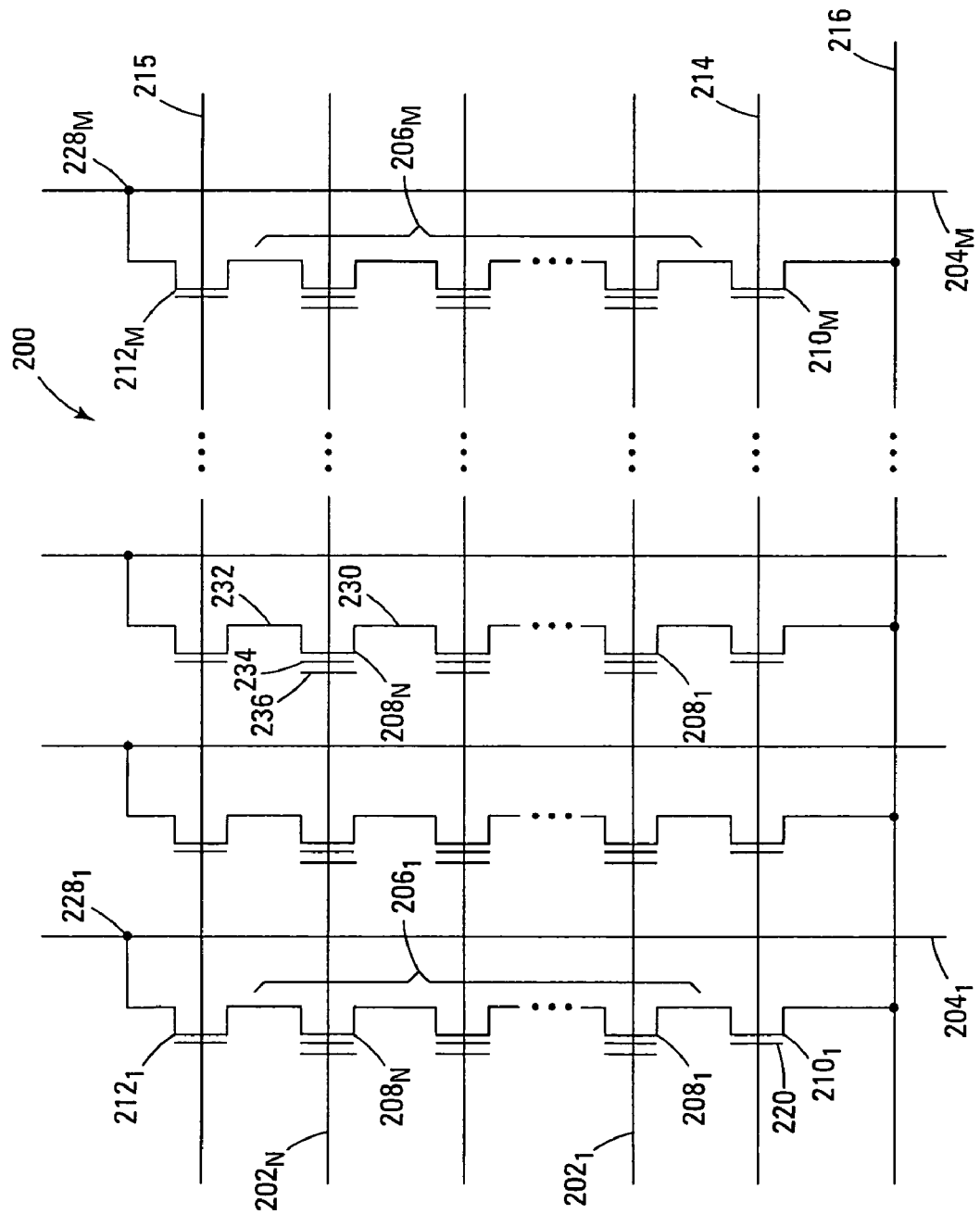
FIG. 2 is a schematic of a NAND memory array in accordance with another embodiment of the invention.

FIG. 2 is a schematic of a NAND memory array 200 as a portion of memory array 104 in accordance with another embodiment of the invention. As shown in FIG. 2, the memory array 200 includes word lines $202_1$ to $202_N$ and intersecting local bit lines $204_1$ to $204_M$. For ease of addressing in the digital environment, the number of word lines 202 and the number of bit lines 204 are each some power of two, e.g., 256 word lines 202 by 4,096 bit lines 204. The local bit lines 204 are coupled to global bit lines (not shown in FIG. 2) in a many-to-one relationship.

Memory array 200 includes NAND strings $206_1$ to $206_M$. Each NAND string includes floating gate transistors $208_1$ to $208_N$, each located at an intersection of a word line 202 and a local bit line 204. The floating gate transistors 208 represent non-volatile memory cells for storage of data. The floating gate transistors 208 of each NAND string 206 are connected in series source to drain between a source select gate 210, e.g., a field effect transistor (FET), and a drain select gate 212, e.g., an FET. Each source select gate 210 is located at an intersection of a local bit line 204 and a source select line 214, while each drain select gate 212 is located at an intersection of a local bit line 204 and a drain select line 215.

A source of each source select gate 210 is connected to a common source line 216. The drain of each source select gate 210 is connected to the source of the first floating gate transistor 208 of the corresponding NAND string 206. For example, the drain of source select gate $210_1$ is connected to the source of floating gate transistor $208_1$ of the corresponding NAND string $206_1$. A control gate 220 of each source select gate 210 is connected to source select line 214. It is common for a common source line to be connected between source select gates for NAND strings of two different NAND arrays. As such, the two NAND arrays share the common source line.

The drain of each drain select gate 212 is connected to the local bit line 204 for the corresponding NAND string at a drain contact 228. For example, the drain of drain select gate $212_1$ is connected to the local bit line $204_1$ for the corresponding NAND string $206_1$ at drain contact $228_1$. The source of each drain select gate 212 is connected to the drain of the last floating gate transistor $208_N$ of the corresponding NAND string 206. For example, the source of drain select gate $212_1$ is connected to the drain of floating gate transistor $208_N$ of the corresponding NAND string $206_1$. It is common for two NAND strings to share the same drain contact.

Typical construction of floating gate transistors 208 includes a source 230 and a drain 232, a floating gate 234, and a control gate 236, as shown in FIG. 2. Floating gate transistors 208 have their control gates 236 coupled to a word line 202. A column of the floating gate transistors 208 is a NAND string 206 coupled to a given local bit line 204. A row of the floating gate transistors 208 are those transistors commonly coupled to a given word line 202.

Figure 3:
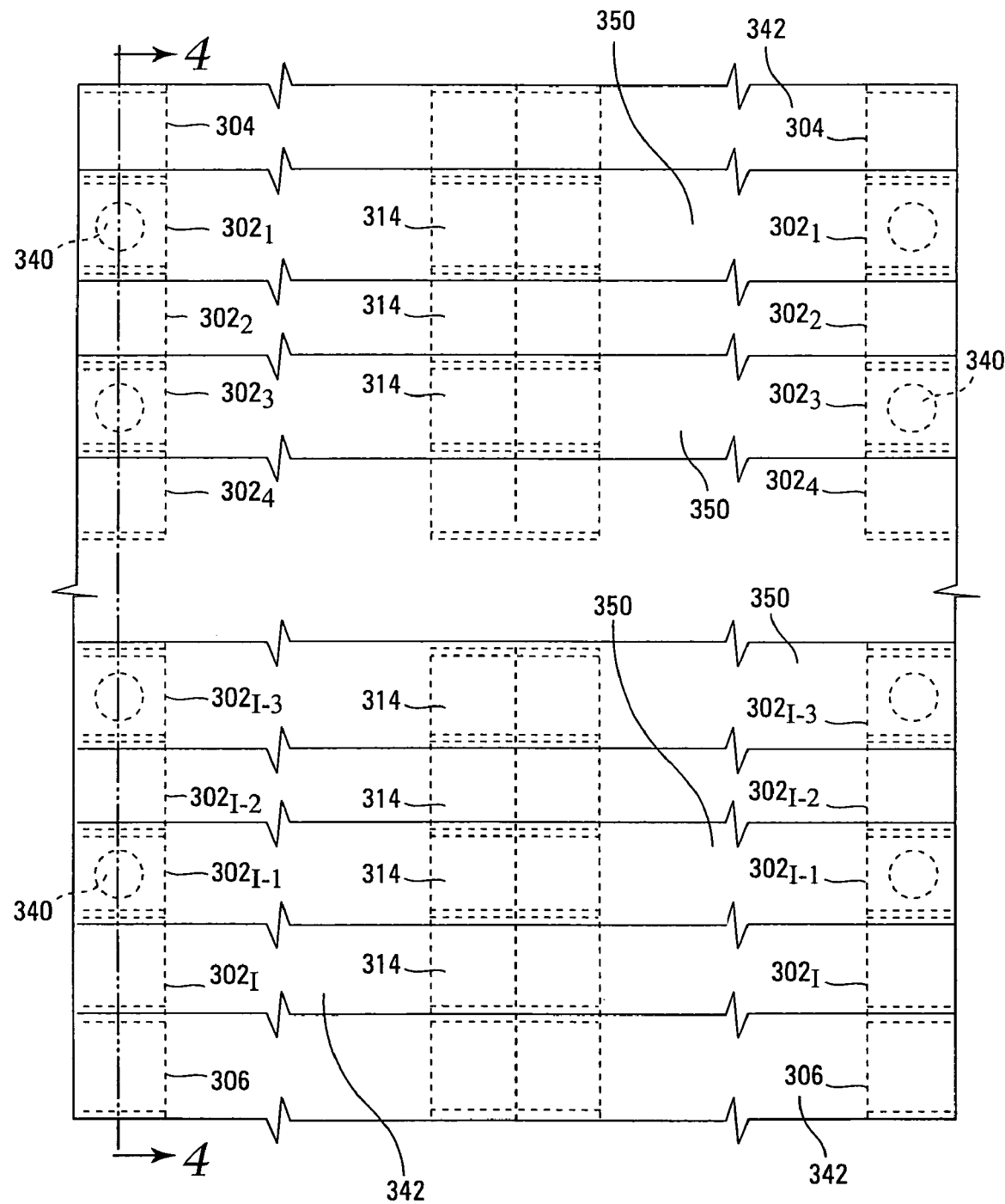
FIG. 3 is a top view of a portion of a memory array, according to another embodiment of the present invention.
Figure 4:
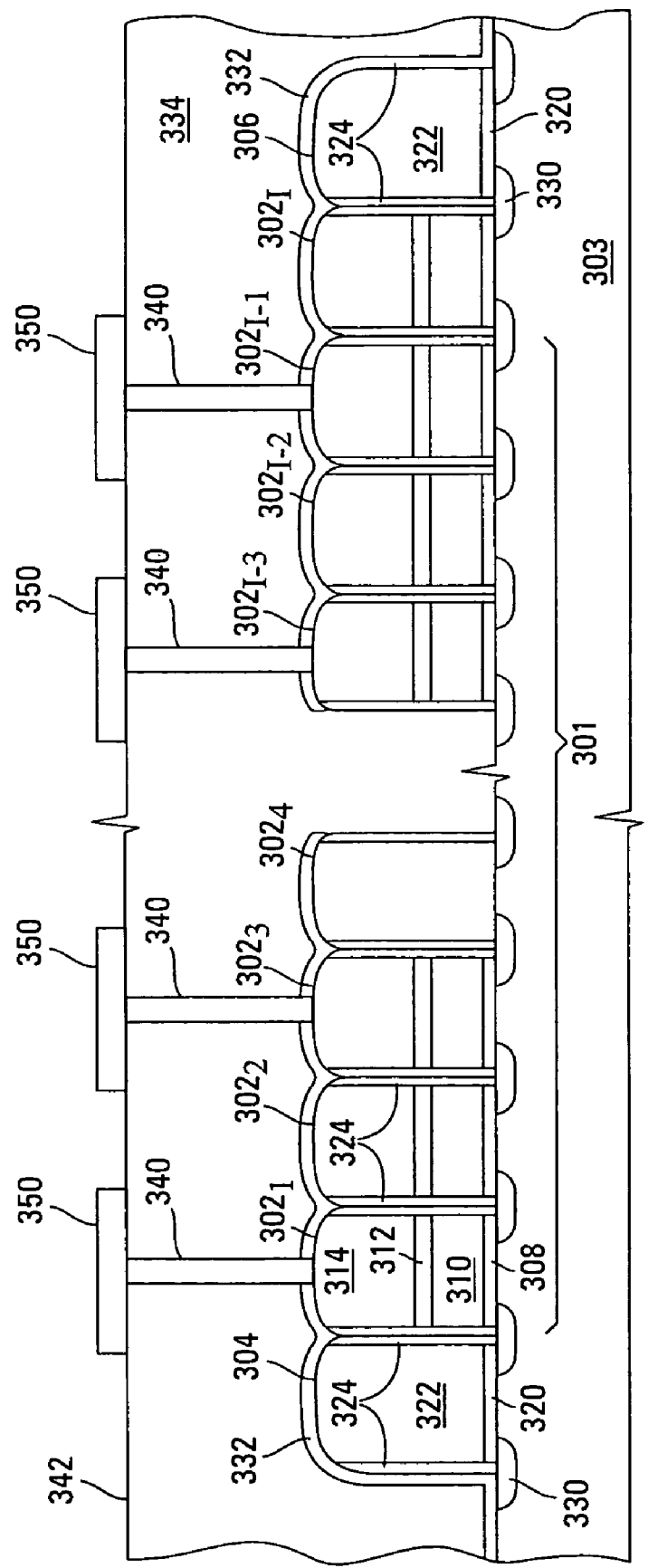
FIG. 4 is a view taken along line 4-4 of FIG. 3.

FIG. 3 is a top view of a portion of a memory array, such as memory array 104 of FIG. 1, according to another embodiment of the present invention. FIG. 4 is a view taken along line 4-4 of FIG. 3. Formation of the structure depicted in FIGS. 3 and 4 is well known and will not be detailed herein. In general, FIG. 4 depicts a string of memory cells $302_1$ to $302_1$ connected in series, e.g., floating-gate transistors connected source to drain in series, to form a NAND string 301 on a substrate 303, e.g. of monocrystalline silicon. A source select gate 304, such as a field effect transistor (FET), is formed on substrate 303 at one end of the NAND string 301. A drain of source select gate 304 is connected to a source of memory cell $302_1$. A drain select gate 306, such as a field effect transistor (FET), is formed on substrate 303 at the other end of the NAND string 301. A source of drain select gate 306 is connected to a drain of memory cell $302_1$.

Each of memory cells 302 includes a tunnel dielectric layer 308, e.g., a layer of tunnel oxide, formed on substrate 303, a floating gate layer 310, e.g., a layer of conductively doped polysilicon, formed on tunnel dielectric layer 308, an interlayer dielectric layer 312, e.g., an oxide, nitride, oxide (ONO) layer, nitride layer, oxide layer, etc., formed on floating gate layer 310, and a control gate layer (or word line) 314, e.g., a layer of conductively doped polysilicon, formed on interlayer dielectric layer 312, as shown in FIG. 4.

Each of select gates 304 and 306 includes a gate dielectric layer 320, e.g., a layer of oxide, formed on substrate 303 and a control gate layer 322, e.g., a layer of conductively doped polysilicon, formed on gate dielectric layer 320, as shown in FIG. 4. For one embodiment, dielectric spacers 324, e.g., of TEOS (tetraethylorthosilicate), are formed on sidewalls of each of memory cells 302 and select gates 304 and 306, as shown in FIG. 4, for separating successive memory cells 302 from each other and for separating source select gate 304 from the first memory cell $302_1$ of NAND string 301 and drain select gate 306 from the last memory cell $302_1$ of NAND string 301.

For one embodiment, source/drain regions 330 are formed in substrate 301, as shown in FIG. 4. For another embodiment, successive memory cells 302 share a source/drain region 330; source select gate 304 and the first memory cell $302_1$ of NAND string 301 share a source/drain region 330; and drain select gate 306 and the last memory cell $302_1$ of NAND string 301 share a source/drain region 330.

For one embodiment, a dielectric layer 332, such as nitride layer, e.g., silicon nitride ($Si_3N_4$), is formed overlying substrate 303, source select gate 304, memory cells 302, and drain select gate 306, as shown in FIG. 4, e.g., using a suitable deposition technique, such as chemical vapor deposition (CVD) etc. A bulk insulation layer (or another dielectric layer) 334 is formed on dielectric layer 332. One example for the insulation layer 334 would be a doped silicate glass. Examples of doped silicate glasses include BSG (borosilicate glass), PSG (phosphosilicate glass), and BPSG (borophosphosilicate glass).

For another embodiment, a contact 340 is formed through insulation layer 334 and dielectric layer 332 and contacts the control gate (or word line) 314 of every other memory cell of NAND string 302, as shown in FIG. 4. Note that each contact 340 extends from an upper surface 342 of insulation layer 334 to a word line 314. Conductive straps 350 are formed on upper surface 342 of insulation layer 334 in contact with contacts 340, as shown in FIG. 4. Conductive straps 350 have a greater electrical conductivity than word lines 314. For one embodiment, contacts 340 may have an electrical conductivity that is greater than or equal to word lines 314.

For one embodiment, a conductive strap 350 is connected to every other word line 314 by one or more contacts 340, as shown in FIGS. 3 and 4. However, the invention is not limited to connecting a conductive strap 350 to every other word line 314, and in general, each word line of subset of the word lines of the memory array are connected to conductive straps. For example, a word line 314 that is connected to a conductive strap 350 may have a plurality of adjacent word lines 314 that are not connected to a conductive strap by one or more contacts 340. For one embodiment, each conductive strap 350 extends the entire length of its corresponding word line 314, as shown in FIG. 3, e.g., it may span several thousand memory cells, in the row direction. For another embodiment, each conductive strap 350 is wider than its corresponding word line 314, as shown in FIGS. 3 and 4. Contacts 340 are spaced apart (or distributed) over the entire length of a word line 314 and connect a word line 314 to a strap 350 after each of a plurality of successive intervals along the entire length of the word line 314, i.e., the plurality intervals constitutes the entire length of the word line. For another embodiment, about 16 or 32 memory cells separate two successive contacts. In this way, a conductive strap 350 straps its corresponding word line 314 along the entire length of that word line 314 and forms a short between the successive contacts 340. For some embodiments, the contacts 340 are evenly spaced.

Strapping each word line of a subset of the word lines, e.g., every other word line or every few word lines, with a conductive strap 350 acts to reduce the overall resistance of those word lines. This acts to reduce the delay of the strapped word lines. Moreover, because of the coupling of adjacent word lines, the reduced delay of the strapped word lines acts to reduce the delay of the unstrapped word lines located adjacent strapped word lines. This is because voltages on the adjacent strapped word lines will pull up the voltage on the unstrapped word lines.

Contacts 340 and conductive straps 350 can be of metal, such as a refractory metal, or a metal-containing material, such as a refractory metal silicide, as well as any other conductive material. The metals of chromium (Cr), cobalt (Co), hafnium (Hf), molybdenum (Mo), niobium (Nb), tantalum (Ta), titanium (Ti), tungsten (W), vanadium (V) and zirconium (Zr) are generally recognized as refractory metals. For some embodiments, contacts 340 and conductive straps 350 can include multiple conductive layers. For example, contacts 340 could include a barrier layer, such as a titanium nitride (TiN) layer, disposed on a word line 314, an adhesion layer, such as a first metal or metal containing layer, e.g., titanium (Ti), titanium silicide, etc., disposed on the barrier layer, and a second metal or metal containing layer, such as tungsten (W), tungsten silicide, etc., on the adhesion layer. For some embodiments, contacts 340 may be of doped polysilicon or a layer of doped polysilicon disposed on the word line 314 and a metal or metal containing layer disposed on the layer of doped polysilicon.

Figure 5:
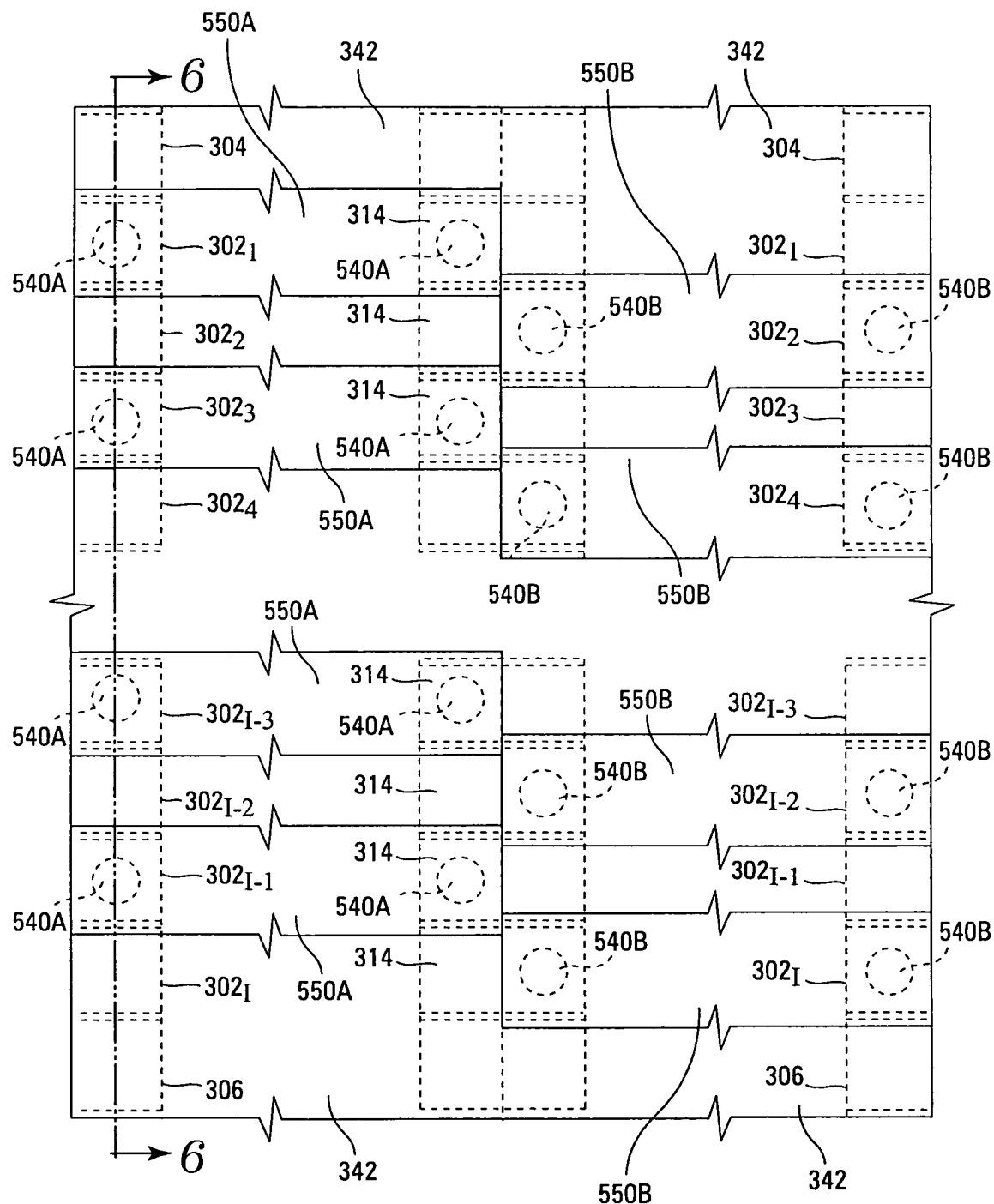
FIG. 5 is a top view of a portion of a memory array, according to another embodiment of the present invention.
Figure 6:
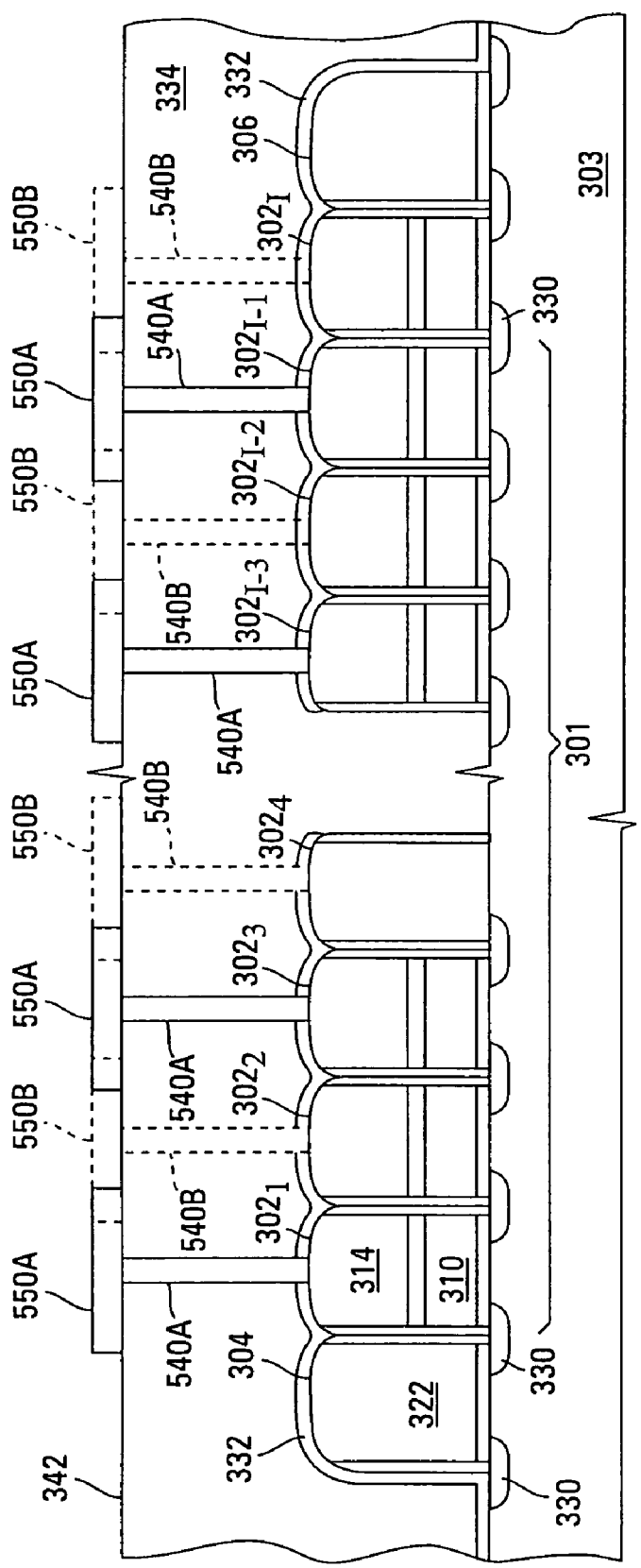
FIG. 6 is a view taken along line 6-6 of FIG. 5.

FIG. 5 is a top view of a portion of a memory array, such as memory array 104 of FIG. 1, according to another embodiment of the present invention. FIG. 6 is a view taken along line 6-6 of FIG. 5. Reference numbers common to FIGS. 3 and 5 and FIGS. 4 and 6 refer to elements that are substantially similar. These elements are described above in conjunction with FIGS. 3 and 4.

Conductive straps 550A and 550B are formed on upper surface 342 of insulation layer 334 and are staggered with respect to each other, as shown in FIG. 5, e.g., every other conductive strap 550A is staggered with respect to every other conductive strap 550B. Conductive straps 550A are formed over every other word line 314 and are substantially aligned therewith (FIGS. 5 and 6). However, conductive straps 550A may be separated by more than one unstrapped word line 314. For one embodiment, each conductive strap 550A extends over a first portion, e.g., about half, of the entire length of its corresponding word line 314 (FIG. 5), e.g., it may span several thousand memory cells, in the row direction. Contacts 540A are spaced over the length of the first portion of a word line 314 and connect the first portion of the word line 314 to a corresponding strap 550A (FIG. 6) after each of a plurality of intervals along the length of the first portion, i.e., the plurality of intervals constitutes the length of the first portion of the word line 314. For one embodiment, about 16 or 32 memory cells separate two successive contacts. For another embodiment, one contact 540A connects a conductive strap 550A to the first portion of its corresponding word line 314. Conductive straps 550A do not extend over second portions of their corresponding word lines 314, and therefore, the second portions of these word lines 314 are unstrapped, as shown in FIG. 5.

The first portion of each word line 314 located adjacent a strapped first portion of a word line 314, e.g., between a pair of strapped first portions of a pair word lines 314, is unstrapped (FIG. 5). Each conductive strap 550B corresponds to and extends over the second portion, e.g., about half of the length of each of these word lines 314 (FIG. 5). For example, a conductive strap 550B may span several thousand memory cells, in the row direction. Contacts 540B are spaced over the length of the second portion of each of these word lines and connect the second portion to a strap 550B (FIG. 6) after each of a plurality of intervals along the length of the second portion, i.e., the plurality of intervals constitutes the length of the second portion. For one embodiment, about 16 or 32 memory cells separate two successive contacts. For another embodiment, one contact 540B connects a conductive strap 550B to the second portion of its corresponding word line 314.

For one embodiment, contacts 540A and 540B and conductive straps 550A and 550B are formed using the same guidance as contacts 340 and conductive straps 350 of FIGS. 3 and 4. For another embodiment, the contacts 540A or 540B are evenly spaced.

In the configuration of FIGS. 5 and 6, strapping the first portion of every other word line or every few word lines with straps 550A acts to reduce the resistance of the first portions of these word lines, which also reduces the overall resistance of these word lines. This acts to reduce the delay of these word lines. Moreover, because of the coupling of adjacent word lines, the reduced delay of the strapped first portions of these word lines acts to reduce the delay of the unstrapped first portions located adjacent strapped first portions. This is because voltages on the adjacent strapped first portions will pull up the voltage on the unstrapped first portions. Strapping the second portion of those word lines having an unstrapped first portion adjacent strapped first portions, with straps 550B acts to reduce the resistance of the second portions these word lines, which also reduces the overall resistance of these word lines. This acts to reduce the delay of each of these word lines. Moreover, because of the coupling of adjacent word lines, the reduced delay of the strapped second portions acts to reduce the delay of the unstrapped second portions located adjacent strapped second portions. This is because voltages on the adjacent strapped second portions will pull up the voltage on the unstrapped second portions. Note that even though a portion of a word line is unstrapped, the overall resistance is lowered because of the reduced length relying on the polysilicon of the word line for conductivity. Therefore, the delay is reduced over the entire word line because the RC (resistive-capacitive) time constant is effectively reduced, e.g., halved.

Therefore, in the configuration of FIGS. 5 and 6, a strapped portion of each word line has a reduced delay due to its being strapped, and an unstrapped portion of each word line has a reduced delay because it is located adjacent a strapped portions of a word line.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of reducing delays in selecting word lines of a NAND memory device, comprising:
   respectively connecting conductive straps only to word lines of a subset of the word lines of the memory device;
   wherein the subset of the plurality of word lines contains fewer than all of the word lines of the memory array.

2. The method of claim 1, wherein the subset comprises every other word line of the memory device.

3. The method of claim 1, wherein respectively connecting conductive straps to word lines of a subset of the word lines of the memory device comprises using one or more contacts to connect a conductive strap to its respective word line.

4. The method of claim 1, wherein the conductive straps extend over an entire length of their respective word lines.

5. A method of reducing delays in selecting word lines of a NAND memory device, comprising:
   connecting a conductive strap to every other word line of the memory device using contacts spaced over an entire length of the every other word lines, each conductive strap extending over the entire length of its respective word line.

6. The method of claim 5, wherein the conductive straps are of metal or a metal containing material.

7. The method of claim 6, wherein the word lines are of polysilicon.

8. The method of claim 7, wherein each contact is of metal, a metal containing material, or polysilicon.

9. The method of claim 5, wherein connecting a conductive strap to every other word line of the memory device using contacts, further comprises:
   passing the contacts through an insulating layer overlying the word lines so that they contact the every other word lines; and
   forming the conductive straps on the insulating layer so that each conductive strap is substantially aligned with a respective one of the every other word lines and contacts the contacts contacting the respective one of the every other word lines.

10. A method of reducing delays in selecting word lines of a NAND memory device, comprising:
    respectively connecting first conductive straps to only first portions of first word lines of the memory device; and
    respectively connecting second conductive straps to only second portions of second word lines of the memory device;
    wherein each first word line is adjacent at least one second word line.

11. The method of claim 10, wherein a second portion of a first word line is adjacent the second portion of a second word line, and wherein the first conductive strap corresponding to that first word line does not extend over the second portion of that first word line.

12. The method of claim 10, wherein a first portion of a second word line is adjacent the first portion of a first word line, and wherein the second conductive strap corresponding to that second word line does not extend over the first portion of that second word line.

13. The method of claim 10, wherein respectively connecting first conductive straps to only first portions of first word lines of the memory device comprises using one or more contacts to connect each first conductive strap to its respective first portion, and wherein respectively connecting second conductive straps to only second portions of second word lines of the memory device comprises using one or more contacts to connect each second conductive strap to its respective second portion.

14. The method of claim 10, wherein the first and second conductive straps are of metal or a metal containing material.

15. The method of claim 14, wherein the word lines are of polysilicon.

16. The method of claim 15, wherein the contacts are of metal, a metal containing material, or polysilicon.

17. A method of reducing delays in selecting word lines of a NAND memory device, comprising:
    respectively connecting first conductive straps to only first portions of first word lines of the memory device using a plurality of contacts spaced only over a length of the respective first portions; and
    respectively connecting second conductive straps to only second portions of second word lines of the memory device using a plurality of contacts spaced only over a length of the respective second portions;
    wherein the first and second conductive straps are staggered with respect to each other; and
    wherein the first and second word lines alternate.

18. The method of claim 17, wherein respectively connecting first conductive straps to only first portions of first word lines of the memory device using a plurality of contacts and respectively connecting second conductive straps to only second portions of second word lines of the memory device using a plurality of contacts, further comprises:

passing the contacts through an insulating layer overlying the word lines so that they contact only the first portions of the first word lines and only the second portions of the second word lines;

forming the first conductive straps on the insulating layer so that each first conductive strap is substantially aligned with the first portion of its respective first word line and contacts the contacts contacting the first portion of the respective first word line; and forming the second conductive straps on the insulating layer so that each second conductive strap is substantially aligned with the second portion of its respective second word line and contacts the contacts contacting the second portion of the respective second word line.

* * * * *